United States Patent
Fujita et al.

(10) Patent No.: US 10,290,522 B2
(45) Date of Patent: May 14, 2019

(54) CONDUCTIVE INTERFACE SYSTEM BETWEEN VACUUM CHAMBERS IN A CHARGED PARTICLE BEAM DEVICE

(71) Applicant: Hitachi High-Technologies Corporation, Minato-ku, Tokyo (JP)

(72) Inventors: Masashi Fujita, Tokyo (JP); Masahiro Tsunoda, Tokyo (JP); Katsunori Onuki, Tokyo (JP); Katsuya Aibara, Tokyo (JP); Seiichi Shindo, Kanagawa (JP); Takaaki Nishimori, Kanagawa (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/893,669

(22) PCT Filed: Mar. 19, 2014

(86) PCT No.: PCT/JP2014/057435
§ 371 (c)(1),
(2) Date: Nov. 24, 2015

(87) PCT Pub. No.: WO2014/192379
PCT Pub. Date: Dec. 4, 2014

(65) Prior Publication Data
US 2016/0133433 A1 May 12, 2016

(30) Foreign Application Priority Data
May 30, 2013 (JP) ................................. 2013-113589

(51) Int. Cl.
*H01L 21/67* (2006.01)
*H01J 37/16* (2006.01)
(Continued)

(52) U.S. Cl.
CPC ........ *H01L 21/67201* (2013.01); *H01J 37/09* (2013.01); *H01J 37/165* (2013.01);
(Continued)

(58) Field of Classification Search
None
See application file for complete search history.

(56) References Cited

U.S. PATENT DOCUMENTS

| | | | |
|---|---|---|---|
| 6,265,723 | B1 | 7/2001 | Morita |
| 6,800,803 | B1 | 10/2004 | Marumo |

(Continued)

FOREIGN PATENT DOCUMENTS

| | | | | |
|---|---|---|---|---|
| JP | 02162755 | A | * | 6/1990 |
| JP | 10074613 | A | * | 3/1998 |

(Continued)

OTHER PUBLICATIONS

International Search Report (PCT/ISA/210) issued in PCT Application No. PCT/JP2014/057435 dated May 13, 2014 with English translation (six pages).

*Primary Examiner* — James Choi
(74) *Attorney, Agent, or Firm* — Crowell & Moring LLP

(57) ABSTRACT

An object of the present invention is to provide a charged particle beam device that suppresses the influence of an external electromagnetic wave, even when a shielding member, such as a vacuum valve, is in the open state. To achieve the above object, a charged particle beam device including a vacuum chamber (111) having an opening (104) that surrounds a sample delivery path is proposed. The charged particle beam device includes a conductive material (118) surrounding the opening (104) for conduction between the vacuum chamber (111) and a conductive member (106) disposed on the atmosphere side. According to an embodiment of the present invention, it is possible to restrict an (Continued)

electromagnetic wave (117) from reaching the sample chamber via the delivery path.

10 Claims, 4 Drawing Sheets

(51) Int. Cl.
    *H01J 37/09*     (2006.01)
    *H01J 37/18*     (2006.01)

(52) U.S. Cl.
    CPC .......... *H01J 37/18* (2013.01); *H01L 21/6719* (2013.01); *H01J 2237/0262* (2013.01); *H01J 2237/0264* (2013.01); *H01J 2237/0266* (2013.01); *H01J 2237/26* (2013.01)

(56) References Cited

U.S. PATENT DOCUMENTS

| | | | |
|---|---|---|---|
| 7,528,602 | B2 | 5/2009 | Seki et al. |
| 2004/0201231 | A1* | 10/2004 | Stacey .............. H01L 21/67259 294/213 |
| 2005/0045821 | A1* | 3/2005 | Noji ..................... G01N 23/225 250/311 |
| 2006/0169208 | A1* | 8/2006 | Shinozaki ............. G03F 7/7075 118/715 |
| 2013/0107491 | A1 | 5/2013 | Imazato et al. |

FOREIGN PATENT DOCUMENTS

| | | | |
|---|---|---|---|
| JP | 11-186779 | A | 7/1999 |
| JP | 2000-306971 | A | 11/2000 |
| JP | 2000306971 | A * | 11/2000 |
| JP | 2004-39981 | A | 2/2004 |
| JP | 2006-287181 | A | 10/2006 |
| JP | 2006-340936 | A | 12/2006 |
| JP | 2006-351622 | A | 12/2006 |
| JP | 2008-277675 | A | 11/2008 |
| JP | 2012-74457 | A | 4/2012 |
| WO | WO 2012/008123 | A1 | 1/2012 |

\* cited by examiner

CONDUCTIVE INTERFACE SYSTEM BETWEEN VACUUM CHAMBERS IN A CHARGED PARTICLE BEAM DEVICE

TECHNICAL FIELD

The present invention relates to a charged particle beam device including a shielding structure to suppress intrusion of a radio wave or the like into the charged particle beam device. In particular, the present invention relates to a charged particle beam device including a shielding structure capable of effectively suppressing intrusion of a radio wave or the like into the charged particle beam device in which irradiation of a sample with a charged particle beam is performed along with replacement of samples.

BACKGROUND ART

A semiconductor manufacturing apparatus or a measurement or inspection apparatus using electron beams (hereinafter referred to as a semiconductor manufacturing and inspection apparatus) may be affected by magnetic field waves in a manufacturing line. An obtained sample image may include distortion. As a result of this, a measurement value includes an error, or measurement is disabled. The semiconductor manufacturing and inspection apparatus using electron beams may generate a measurement error especially in a semiconductor manufacturing line where the electron beams are affected by an electromagnetic field leaked from an adjacent apparatus, or an electromagnetic field generated during automatic operation of the apparatus.

To reduce the influence of the electromagnetic field on the electron beams, a shielding material is used to cover the apparatus in PTL 1 to decrease the influence of the electromagnetic field. According to PTL 1, a door vertical mechanism including the shielding material is provided at a delivery port, through which a sample is delivered into the apparatus, to decrease leakage and entrance of the electromagnetic field from and into the apparatus. In PTL 2, a magnetic field shielding apparatus having a high shielding effect is provided, in which a gap between the body and the door of the magnetic field shielding apparatus is tightly sealed with an electrically or magnetically connected member.

CITATION LIST

Patent Literature

PTL 1: JP 2000-306971 A (corresponding to U.S. Pat. No. 6,800,803)

PTL 2: JP 2006-340936 A (corresponding to U.S. Pat. No. 7,528,602)

SUMMARY OF INVENTION

Technical Problem

PTL 1 discloses an electromagnetic wave shielding plate disposed between the delivery path of the sample and the external atmosphere to prevent external leakage of the electromagnetic wave. PTL 2 discloses a magnetic field measurement apparatus including a magnetic field shielding door to shield an external magnetic field.

Meanwhile, in a charged particle beam device, such as an electron microscope device that performs measurement or inspection of semiconductor wafers or the like, a sample is guided into the apparatus while a previous sample is subject to processing with the charged particle beam, in order to reduce processing time. In such a charged particle beam device thus performing the processing, a shielding member (e.g., a vacuum valve) is provided between a vacuum chamber and a space in the atmosphere, and the shielding member needs to be opened to secure a delivery path of the sample. It is difficult to cover the delivery path of the sample all the time with the shielding member or the like in the charged particle beam device. It is therefore desired to provide a measure to suppress the influence of external electromagnetic waves, even when the shielding member is positioned outside the delivery path.

In the case of a charged particle beam device including a preliminary exhaust chamber to achieve high throughput, the charged particle beam device is put into two states, i.e., an open state where a vacuum valve provided between the preliminary exhaust chamber and the atmosphere is open, and a closed state where the vacuum valve is closed, while the charged particle beam device ejects the charged particle beam. As a result of this, the influence of the external electromagnetic wave on the charged particle beam may change. Such a change of the influence on the beam should be suppressed especially in the charged particle beam device that requires reproducibility of measurement or inspection.

A charged particle beam device that aims to suppress the influence of the external electromagnetic wave even when a shielding member is in the open state will be described below. The charged particle beam device opens/closes the shielding member to secure a delivery path for a different sample while an existing sample is present in a sample chamber.

Solution to Problem

To achieve the above object, a charged particle beam device according to an embodiment includes a vacuum chamber having an opening that surrounds a sample delivery path is proposed. The charged particle beam device includes a conductive material that surrounds the opening for conduction between the vacuum chamber and a conductive member disposed on the atmosphere side.

In addition, to achieve the above object, a charged particle beam device according to another embodiment includes a vacuum chamber having an opening that surrounds a sample delivery path is proposed. The charged particle beam device includes a conductive sheet with a plurality of openings formed therein, a conductive mesh, or a plurality of conductive tapes. The conductive sheet, the conductive mesh, or the conductive tapes is used for connection between the vacuum chamber and the conductive member disposed on the atmosphere side.

Advantageous Effects of Invention

In the structure described above, it is possible to secure the sample delivery path by restricting the electromagnetic wave from reaching the sample chamber via the delivery path, even when the shielding member of the vacuum chamber is in the open state.

DESCRIPTION OF EMBODIMENTS

Figure 1:
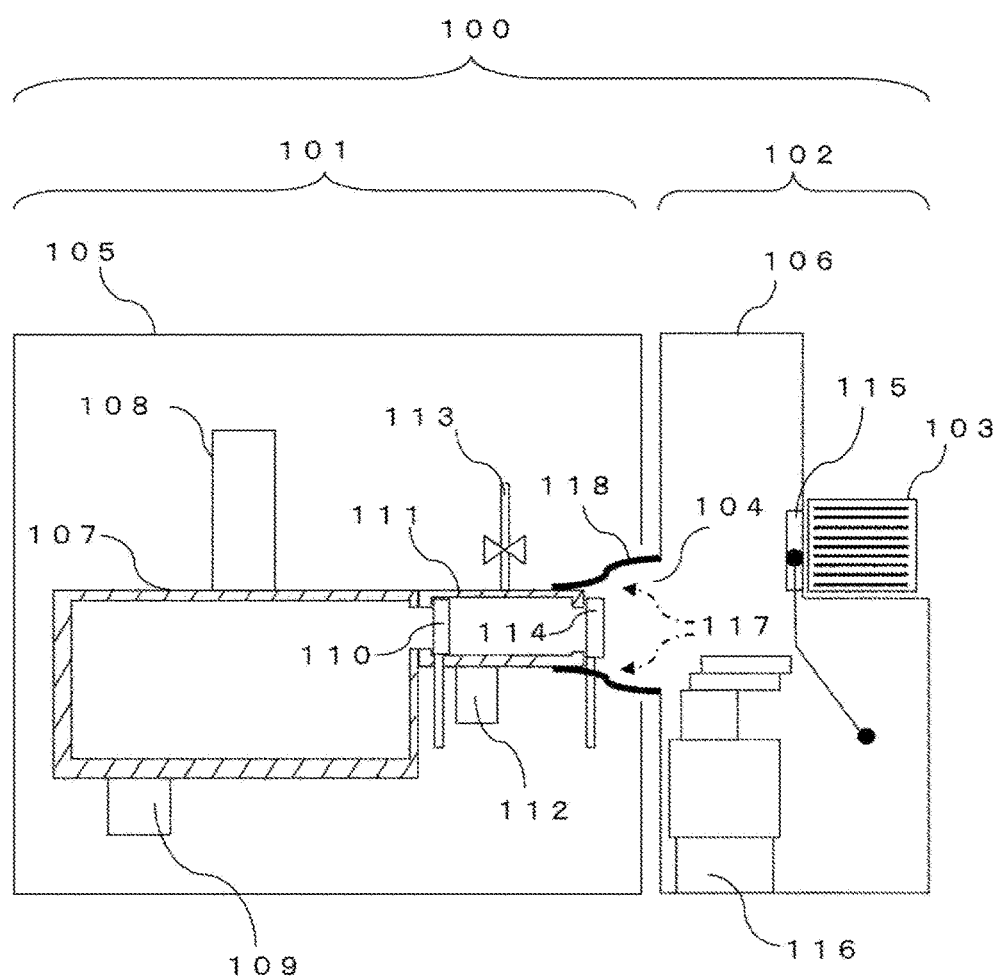
FIG. 1 illustrates an example structure of an electron microscope device 100.

An embodiment described below relates to a charged particle beam device and, in particular, relates to a charged particle beam device including a preliminary exhaust chamber (vacuum chamber) where preliminary exhaust of a sample atmosphere is performed before the sample is guided into a sample chamber. In the following description, an electron microscope is described as an example of the charged particle beam device of the embodiment, but other charged particle beam devices, such as an ion beam device that ejects a focused ion beam, may also be used.

The electron microscope including the preliminary exhaust chamber can deliver the next semiconductor wafer (sample) to be inspected into the device during measurement or inspection using the electron beam. More specifically, vacuum exhaust of a different sample atmosphere can be performed in the preliminary exhaust chamber, while processing such as measurement or inspection is carried out in the sample chamber. When the processing of the sample is ended in the sample chamber, the next sample can immediately be guided into the sample chamber (replacement of the sample).

The electron microscope including the preliminary exhaust chamber can therefore achieve high throughput by the processing in the sample chamber and the preliminary exhaust. To achieve this, a delivery port (opening) surrounding the sample delivery path of the electron microscope device needs to be opened along with the processing of the sample. When the delivery port is closed, the shielding material, such as a vacuum valve, becomes a barrier against the electromagnetic wave between the atmosphere side where the source of the electromagnetic wave is placed and the sample chamber where an object to be irradiated with the electron beam exists. Such a barrier does not exist when the delivery port is open. Since the barrier is not provided while the sample is delivered, and continuously covering the electron microscope device thoroughly with the shielding material is difficult.

It may also be possible to suspend delivery of the next sample to be processed until the processing in the sample chamber is finished, in order to suppress the influence of the electromagnetic wave. By doing this, the device is not affected by the electromagnetic field, as the device is always covered by the shielding material during the processing. However, the processing time increases significantly, and productivity decreases.

In the embodiment described below, the space between the periphery of the sample delivery port of the vacuum chamber and the conductive member of the sample delivery portion is connected, for example, with a conductive material, in order to realize both high throughput and suppressing of the influence of the electromagnetic wave. The conductive material is disposed without being interfered with a moving track of the sample.

The influence of the electromagnetic field can be reduced without covering the delivery port of the device thoroughly with the shielding material in the above structure. It is therefore possible to provide a device in which the measurement value is not affected by the electromagnetic field and the processing time does not increase even when the sample is delivered into the device during processing.

An embodiment will be described below by referring to the accompanying drawings.

First Embodiment

In the present embodiment, an electron microscope device 100 for inspecting a semiconductor wafer is described. FIG. 1 illustrates an example structure of the electron microscope device 100 for inspecting a semiconductor. The electron microscope device 100 includes an electron microscope body 101 for inspecting a semiconductor wafer, a sample delivery portion 102 for delivering the semiconductor wafer to the electron microscope body 101, and a wafer storage pod 103 that stores the semiconductor wafer.

The electron microscope body 101 is covered by a conductive material 105, such as iron, stainless steel, or the like, and includes a delivery port 104 through which the semiconductor wafer is delivered to the electron microscope. Similarly, the sample delivery portion 102 is covered by a conductive material 106 that is grounded and made of a conductive material, such as iron, stainless steel, or the like.

A vacuum chamber (sample chamber) 107 which is normally kept in the vacuum state, and an electron gun 108 disposed in the upper portion of the vacuum chamber 107 are provided inside the conductive material 105 of the electron microscope body. The vacuum chamber 107 is kept in the vacuum state by a vacuum chamber pump 109 and a vacuum chamber valve 110. Since the semiconductor wafers in the wafer storage pod 103 disposed on the atmosphere side cannot be delivered directly into the vacuum chamber 107, a vacuum control chamber (preliminary exhaust chamber) 111 capable of creating an atmosphere state and a vacuum state is provided adjacent to the vacuum chamber 107. In the vacuum control chamber 111, a vacuum control chamber pump 112, a leak valve 113 that supplies nitrogen, and a vacuum control chamber valve 114 are used to create the vacuum state and the atmosphere state.

When the semiconductor wafer stored in the wafer storage pod 103 is introduced into the vacuum chamber 106, a pod door 115 of the sample delivery portion 102 is opened so as to allow a delivery robot 116 to take out the semiconductor wafer from the wafer storage pod 103. The delivery robot 116 delivers the semiconductor wafer through the delivery port 104 to vacuum control chamber 111.

The electron microscope device illustrated in FIG. 1 includes a controller which is not illustrated. According to predetermined conditions, the controller controls the electron gun (electron microscope mirror body) 108, the vacuum chamber pump 109, the vacuum chamber valve 110, the vacuum control chamber 112, the leak valve 113, the vacuum control chamber valve 114, the pod door 115, and the delivery robot 116. The controller opens the vacuum control chamber valve 114, takes out the wafer from the wafer storage pod 103 by the delivery robot 116, delivers the wafer to the vacuum control chamber 111 by the delivery robot 116, closes the vacuum control chamber valve 114, exhausts vacuum by the vacuum control chamber pump 112, opens the vacuum chamber valve 110, delivers the wafer to the vacuum chamber 107 by a robot not illustrated (or replaces the wafer if the wafer is present in the vacuum chamber 107), closes the vacuum chamber valve 110, and executes the measurement processing by controlling the electron microscope mirror body and a sample stage which is not illustrated. The controller performs the above steps in this order. After the measurement is finished, the above steps are performed reversely to store the wafer in the wafer storage pod 103.

To achieve the high throughput of the device, the controller controls in such a manner that the vacuum control chamber valve 114 is opened to secure the delivery path, and the wafer is introduced, replaced, or collected by the delivery robot 116, while the wafer is present in the sample chamber and subject to the measurement processing (beam irradiation processing). At this time, the external electromagnetic field 117 enters the electron microscope body 101 at the delivery port 104, causing an influence on the electron beam ejected from the electron gun 108.

In the present embodiment, the periphery of the opening of the vacuum control chamber 111 and the conductive material 106 of the sample delivery portion are connected with the conductive material 118 to decrease the entrance of the electromagnetic field 117. At this time, both the conductive material 105 of the vacuum control chamber 111 and the electron microscope body and the conductive material 106 of the sample delivery portion need to be grounded. In the embodiment described below, the conductive material 106 is described as an example of the conductive member provided on the atmosphere side of the vacuum control chamber 111, but the conductive member is not limited thereto. Alternatively, a different conductive member which is grounded, for example, may be provided between the delivery robot 116 and the vacuum control chamber 111 to connect the conductive member to the conductive material 118.

Figure 2:
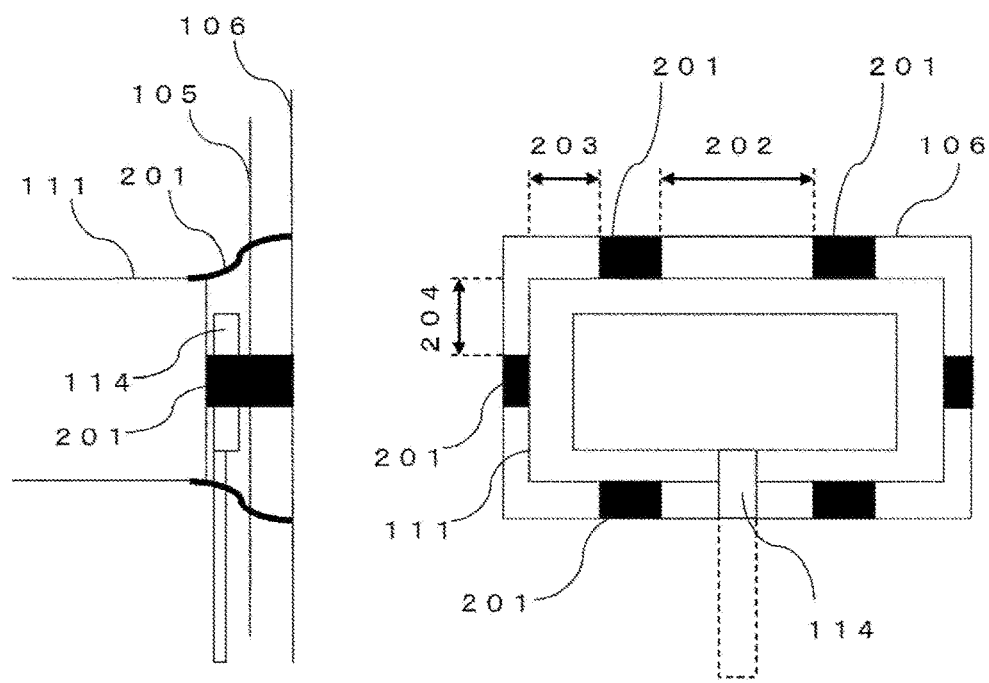
FIG. 2 illustrates an example of how a conductive material is connected in the electron microscope device 100.

FIG. 2 illustrates an example of how a conductive material 118 is connected in the electron microscope device 100. In the example of FIG. 2, a conductive tape 201 having a width of 50 mm is used for connection at six places as a conductive material. To reduce the entrance of the electromagnetic wave from the outside, it is crucial to determine a distance between adjacent conductive tapes 201. When the adjacent conductive tapes are disposed horizontally, the distance between the conductive tapes is indicated by a distance 202 in FIG. 2.

When the adjacent conductive tapes are not disposed horizontally, a distance obtained by adding a distance 203 and a distance 204 indicated in FIG. 2 is regarded as the distance between the conductive tapes. In the case of reducing the electromagnetic wave equal to or smaller than 200 MHz, for example, the wavelength of the electromagnetic field of 200 MHz is 1.5 m. The distance between the conductive tapes is at least set equal to or smaller than ¼ of the wavelength, i.e., 0.375 m. The distance may more preferably be set equal to or smaller than 1/10 of the wavelength of the electromagnetic field to be reduced.

By disposing belt-like conductive materials at proper distances described above so as to surround the opening of the vacuum chamber, it is possible to restrict the intrusion of the external electromagnetic wave into the sample chamber without directly shielding the opening of the vacuum chamber.

The conductive tapes are thus used to connect to the conductive materials 106 of the vacuum control chamber 111 and the sample delivery portion 102. Alternatively, a wide sheet of conductive tape may be used.

If the sample delivery portion 102 is of a mini-environment system, it is necessary to use a sheet of conductive tape with a plurality of holes formed therein or a mesh-like conductive tape. A high cleanness downflow achieved by a filter and a fan is present in the sample delivery portion of the mini-environment system. When the sheet of conductive tape is used to seal the conductive material 106 of the sample delivery portion of the mini-environment system with the vacuum control chamber 111, convection occurs in the vicinity of the opening 104 by the downflow from the delivery port 104, causing foreign substances to float. Such foreign substances may be attached to a fine pattern on the semiconductor wafer during the delivery of the semiconductor wafer, a defect such as disconnection may occur. If it is desired to use the sheet of conductive tape, the conductive tape with the holes formed therein or the mesh-like conductive tape is used. A circumferential length of a hole or an outer peripheral length of the opening of the mesh is set equal to or smaller than ¼ of the wavelength of the electromagnetic wave to be reduced. It is further preferable if the wavelength is equal to or smaller than 1/10 of the wavelength, if possible.

The belt-like conductive tape may be made of a flexible member in order to suppress propagation of the oscillation between the sample delivery portion (the mini-environment) 102 and the electron microscope body. In this case, a conductive cloth made by weaving conductive fibers (threads) in the conductive tape, or a thin sheet-like member coated with the conductive member, for example, may be used. When a high rigidity member is used in place of the flexible member, it may also be possible to suppress the propagation of oscillation by interposing a conductive buffer material between the vacuum chamber and/or the mini-environment.

The conductive tapes illustrated in FIG. 2 are respectively disposed for four sides of the vacuum chamber that forms the opening (sample delivery port) of the vacuum chamber. That is, the conductive tapes are disposed so as to surround the sample delivery path of the vacuum chamber. As described above, there is a proper distance between the tapes according to the frequency of the electromagnetic wave to be reduced. However, since the size of the semiconductor measurement apparatus is expected to increase in the future, the opening corresponding to such an increased semiconductor wafer radius is necessary. At the same time, a track on which the delivery mechanism passes to deliver the semiconductor wafer has to be secured. Thus, it is desirable to narrow the distance between the tapes by disposing at least a piece of tape on each of the four sides.

The conductive member described in the above embodiment is able to suppress the influence of the electromagnetic wave on the electronic beam, and can also lead to the improvement of the reproducibility of measurement in the apparatus for measurement or inspection of the semiconductor devices. In the electron microscope including the preliminary exhaust chamber, the vacuum valve provided on the atmosphere side of the preliminary exhaust chamber may be opened or closed. This means that the influence of the electromagnetic wave may change between the open state of the valve and the close state of the valve. The existence of the electromagnetic wave may become a factor to decrease the measurement reproducibility. According to the embodiment of the present invention, it is possible to suppress the electromagnetic wave that passes through the opening of the vacuum chamber regardless of whether the vacuum valve is opened or closed. The change of the electromagnetic wave in association with the open/close of the vacuum valve can be suppressed and, as a result of this, the measurement reproducibility can be improved.

Second Embodiment

In the present embodiment, an electron microscope device 300 that reduces entrance of the electromagnetic field when the delivery port 104 has a large opening area. The area of the delivery port 104 needs to be larger when the delivery robot 116 is an articulated robot having a large movable range.

Figure 3:
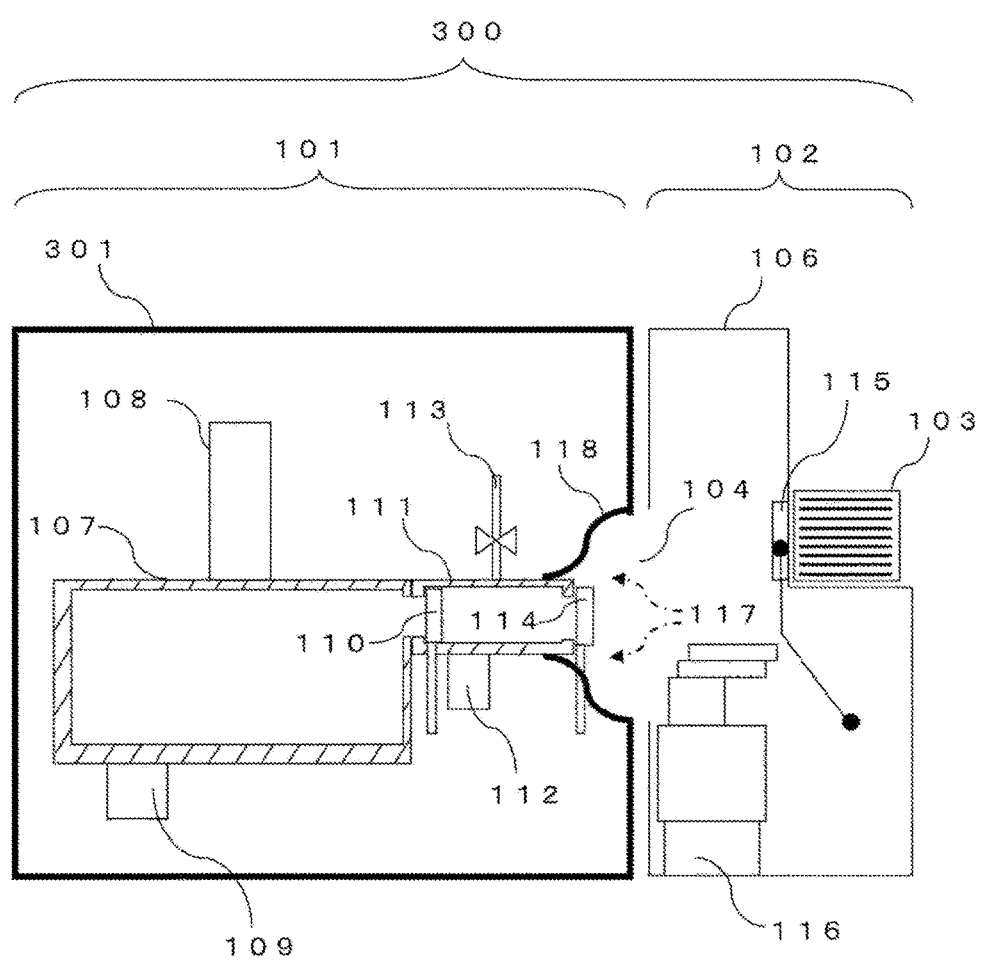
FIG. 3 illustrates an example structure of an electron microscope device 300.

FIG. 3 illustrates an example structure of an electron microscope device 300. The same reference signs are given to portions of the electron microscope device 100 of FIG. 1 having the same functions as those already described by referring to FIG. 1, and the description thereof will not be repeated.

The electron microscope body 101 is covered by a shielding material 301, such as aluminum, permalloy, or the like, to decrease the influence of the electromagnetic field. The shielding material 301 has the delivery port 104 to deliver the semiconductor wafer. The conductive material 118 is connected to a shield 301. Since the delivery port 104 is large in the electron microscope device 300, the longitudinal distance of the conductive material 118 is over 100 mm. In this case, adjacent conductive materials 118 may be connected together with a different conductive material to decrease entrance of the electromagnetic field.

Figure 4:
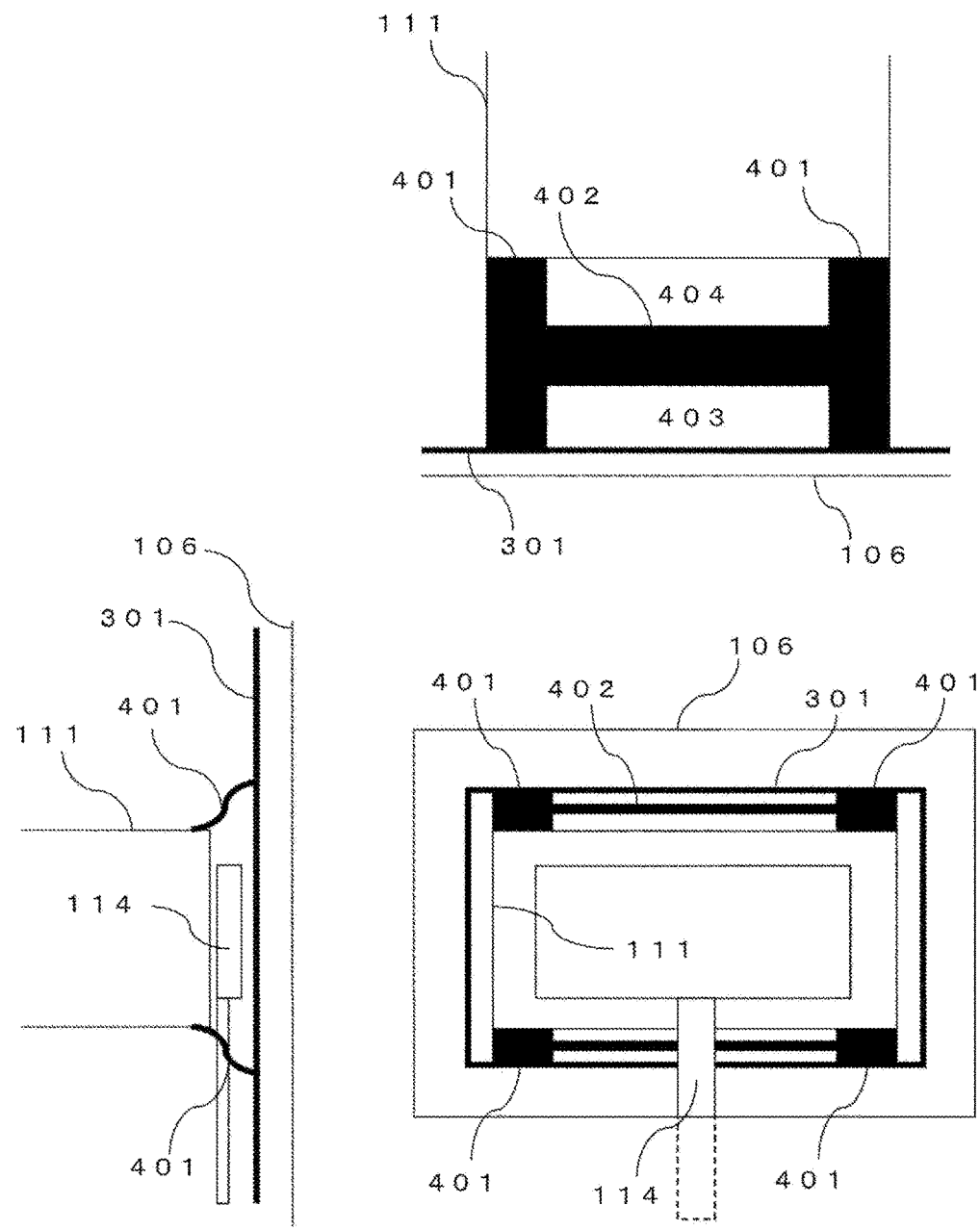
FIG. 4 illustrates an example of how a conductive material is connected in the electron microscope device 300.

FIG. 4 illustrates an example of how the conductive material 118 is connected in the electron microscope device 300. Similar to FIG. 2, a conductive tape 401 having a width of 50 mm is used as the conductive material. The conductive tape 401 is used to connect the vacuum control chamber 111 with the shield 301. Adjacent conductive tapes 401 are connected with a conductive tape 402. In this case, the circumferential length of net-like gaps 403, 404 surrounded by the shield 301, the vacuum control chamber 111 and the conductive tapes 401, 402 is set equal to or smaller than ¼ of the wavelength of the electromagnetic field to be reduced. A further effect can be expected if the wavelength is equal to or smaller than ⅒ of the wavelength, if possible. It is indeed possible to further increase the number of the conductive tapes to adjust the circumferential length of the net-like gaps 403, 404 of the conductive tapes.

To increase the effect of the conductive tapes, the circumferential lengths of the net-like gaps of the conductive tapes may be set differently. This is to prevent resonance of the electromagnetic waves having the same frequency and decrease the influence on the electron microscope.

With the above embodiment, the influence of the electromagnetic field can be decreased in the electron microscope using the vacuum chamber and the sample delivery portion without covering the delivery port with the shielding material.

REFERENCE SIGNS LIST 100 electron microscope device
101 electron microscope body
102 sample delivery portion
103 wafer storage pod
104 delivery port
105 conductive material of the electron microscope body
106 conductive material of the sample delivery portion
107 vacuum chamber
108 electron gun
109 vacuum chamber pump
110 vacuum chamber valve
111 vacuum control chamber
112 vacuum control chamber pump
113 leak valve
114 vacuum control chamber valve
115 pod door
116 delivery robot
117 electromagnetic field
118 conductive material
201 conductive tape
202 distance between conductive tapes
203 distance between conductive tapes
204 distance between conductive tapes
300 electron microscope device
301 shielding material of the electron microscope body
401 conductive tape
402 conductive tape
403 gap of the conductive tape
404 gap of the conductive tape

The invention claimed is:

1. A charged particle beam device including a sample chamber, the charged particle beam device comprising:
    a preliminary exhaust chamber having a first opening provided on an air side for exhausting atmosphere in a periphery of the sample to be introduced into the sample chamber so that the atmosphere becomes at a vacuum state and for introducing the sample, and having a valve for opening and closing the first opening;
    a sample delivery robot which delivers the sample from an atmospheric space to the preliminary exhaust chamber;
    a shielding member disposed between the preliminary exhaust chamber and the sample delivery robot so as to be spaced apart from the preliminary exhaust chamber and having a second opening through which the sample passes, wherein the shielding member is grounded; and
    a conductive member including a plurality of belt-like conductive tapes disposed at a predetermined interval with a plurality of predetermined gaps, a conductive sheet having a plurality of openings, or a conductive mesh with a plurality of openings,
    wherein one end of the conductive member is in contact with the preliminary exhaust chamber and another end of the conductive member is in contact with the shielding member,
    wherein a part of the conductive member is disposed so as to surround a sample delivery path of the robot between the first opening and the second opening while maintaining flexibility.

2. The charged particle beam device according to claim 1, wherein the preliminary exhaust chamber includes a vacuum valve that shields a space between an internal space of the preliminary exhaust chamber and the sample delivery device, and
    the charged particle beam device further comprising:
    a controller configured to open and/or close the vacuum valve while the sample is placed in the sample chamber of the charged particle beam device.

3. The charged particle beam device according to claim 1, wherein the conductive member includes the plurality of belt-like conductive tapes and each of the plurality of belt-like conductive tapes is disposed for each of four sides forming the first opening of the preliminary exhaust chamber on the sample delivery device side.

4. The charged particle beam device according to claim 3, wherein each of the plurality of predetermined gaps between the plurality of belt-like conductive tapes is set according to a frequency band of an electromagnetic wave to be shielded.

5. The charged particle beam device according to claim 1, wherein the conductive member includes the conductive sheet and the plurality of openings in the conductive sheet are set according to a frequency band of an electromagnetic wave to be shielded.

6. The charged particle beam device according to claim 1, wherein the conductive member includes the conductive mesh and a circumferential length of each of the plurality of openings of the conductive mesh is set according to a frequency band of an electromagnetic wave to be shielded.

7. The charged particle beam device according to claim 1, wherein the conductive member includes the conductive mesh and the plurality of openings in the conductive mesh are set according to a frequency band of an electromagnetic wave to be shielded.

8. A charged particle beam device including a sample chamber, the charged particle beam device comprising:
- a preliminary exhaust chamber having a first opening provided on an air side for exhausting atmosphere in a periphery of a sample to be introduced into the sample chamber so that the atmosphere becomes at a vacuum state and for introducing the sample, and having a valve for opening and closing the first opening;
- a sample delivery robot that delivers the sample from an atmospheric space to the preliminary exhaust chamber;
- a shielding member disposed between the preliminary exhaust chamber and the sample delivery robot so as to be spaced apart from the preliminary exhaust chamber and having a second opening through which the sample passes, wherein the shielding member is grounded; and
- a conductive member including a conductive sheet with a plurality of openings, a conductive mesh with a plurality of openings, or a plurality of conductive tapes arranged at a predetermined interval,
- wherein one end of the conductive member is in contact with the preliminary exhaust chamber and another end of the conductive member is in contact with the shielding member,
- wherein a part of the conductive member is set so as to surround the sample delivery path of the robot between the first opening and the second opening while maintaining flexibility.

9. The charged particle beam device according to claim 8, wherein the sample chamber is a preliminary exhaust chamber.

10. The charged particle beam device according to claim 9, wherein the preliminary exhaust chamber includes a vacuum valve that shields a space between an internal space of the preliminary exhaust chamber and the atmosphere, the charged particle beam device further comprising:
- a controller configured to open and/or close the vacuum valve while a sample is placed in the sample chamber of the charged particle beam device.

* * * * *